Feb. 27, 1968 J. W. MOTTO, JR 3,371,267

SEMICONDUCTOR REGULATOR FOR DYNAMOELECTRIC MACHINES

Filed March 9, 1965

WITNESSES:
Bernard R. Gieguey
James F. Young

INVENTOR
John W. Motto, Jr.
BY Donald R. Lackey
ATTORNEY 3,371,267
SEMICONDUCTOR REGULATOR FOR DYNAMOELECTRIC MACHINES John W. Motto, Jr., Greensburg, Pa., assignor to Westinghouse Electric Corporation, Pittsburgh, Pa., a corporation of Pennsylvania Filed Mar. 9, 1965, Ser. No. 438,267
7 Claims. (Cl. 322—28)

ABSTRACT OF THE DISCLOSURE

A regulating system for a dynamoelectric machine having a semiconductor gate controlled switch connected in series with the field winding of the dynamoelectric machine and a source of electrical potential. Means responsive to the electrical quantity of the dynamoelectric machine to be regulated provides turn-off signals to the gate controlled switch. Turn-on signals for the gate controlled switch are provided a predetermined fixed time after the gate controlled switch is turned off. The regulating action is obtained by ratioing the variable "on" time of the gate controlled switch against the constant "off" time.

Figure 1:
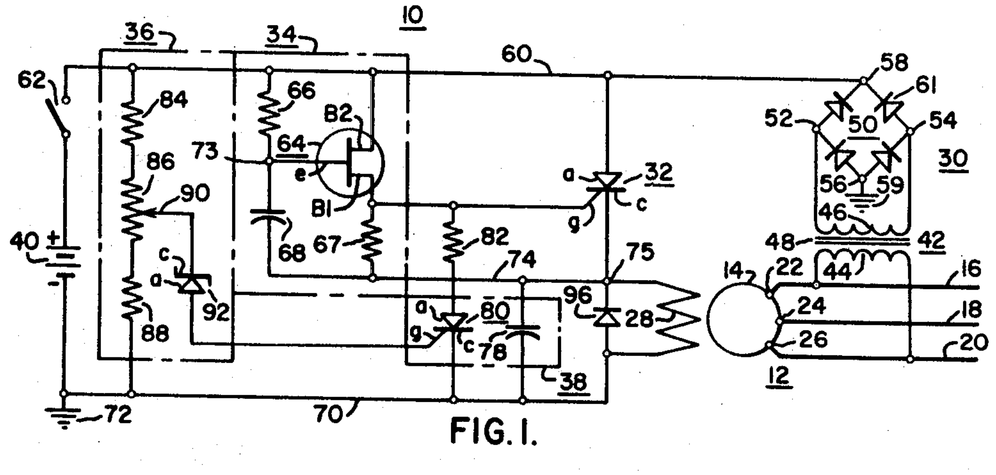

Regulating systems for dynamoelectric machines commonly employ some type of switching means connected in series circuit relation with the field circuit of the dynamoelectric machine. The switching means is made responsive to the electrical quantity to be regulated through a feedback loop, with the switching means controlling the average field current flowing through the field circuit by controlling the ratio of switch "on" time to switch "off" time.

The designer of regulating systems for dynamoelectric machines is continually striving to reduce the physical size of the regulating system package and also reduce its cost. These objectives, however, must not be achieved by sacrificing reliability and efficiency.

The development of semiconductors has aided the designer in reducing the system package size and cost, with junction type transistors, operating in switching mode for efficiency reasons, commonly being used for the switching means. It would be desirable, however, to replace the junction transistor as the switching means with a semi-conductor switch which simply has high and low impedance conditions.

Semiconductor controlled rectifiers or three-terminal semiconductor switching elements of the type disclosed in U.S. Patent 2,877,359 to I. M. Ross, have limitations, however, when applied to regulating systems, because of their functional similarity to thyratron tubes. They are easily switched from their high impedance to their low impedance condition, but in direct current circuits it is difficult to achieve switching from the low impedance to the high impedance condition. Controlled rectifiers are now available however, which are readily bilaterally switched at will, from high to the low impedance condition, and from the low to the high impedance condition, such as the three terminal semiconductor switching element disclosed by J. M. Goldey et al. in U.S. Patent 2,993,154. To distinguish between the two types of semiconductor switching elements, the former will be called a semiconductor controlled rectifier throughout the specification, and the latter will be called a semiconductor gate controlled switch. It would be desirable to utilize a semiconductor gate controlled switch as disclosed in the latter patent, as the series switching element in regulating systems, and achieve "on" and "off" control of the element with a minimum number of components, to achieve a minimum package size and cost, and also to provide an extremely reliable, highly efficient regulating system.

Accordingly, it is an object of this invention to provide a new and improved regulating system for dynamoelectric machines.

Another object of the invention is to provide a new and improved regulating system for dynamoelectric machines which utilizes a semiconductor gate controlled switch in the field circuit.

A further object of the invention is to provide a new and improved regulating system for dynamoelectric machines which utilizes a semiconductor gate controlled switch to control the average field current, and which provides "on-off" signals for the switch with a minimum number of components, to achieve a reliable, efficient system.

Still another object of the invention is to provide a new and improved regulating system for dynamoelectric machines which utilizes a semiconductor gate controlled switch, and which has a constant predetermined "off" time and a controllable "on" time, to provide the average field current required to maintain the electrical quantity to be controlled at a predetermined magnitude.

Briefly, one embodiment of the invention utilizes a unijunction transistor and first capacitor to provide a turn-on signal for a semiconductor gate controlled switch having main electrodes and a control electrode, upon start-up of the regulating system and each time the semiconductor gate controlled switch is turned off. A voltage sensitive semiconductor element, such as a Zener diode, a semiconductor controlled rectifier, and a second capacitor are arranged to provide the turn-off signal for the semiconductor gate controlled switch, with the Zener diode applying a signal to the controlled rectifier when a predetermined system voltage is reached, switching the controlled rectifier from its high to its low impedance condition, which allows the second capacitor to discharge and apply a turn-off signal to the semiconductor gate controlled switch. The charging time of the first capacitor determines when the unijunction transistor will apply a turn-on signal to the semiconductor gate controlled switch, thus providing a uniform period of "off" time between controllable periods of "on" time.

A second embodiment of the invention provides the turn-on signals to the semiconductor gate controlled switch through a resistor, capacitor and diode arrangement, which eliminates the unijunction transistor. The required uniform delay time in providing turn-on signals for the semiconductor gate controlled switch is provided by the charging rate of the capacitor, the threshold voltage of the semiconductor gate controlled switch, and the inherently high impedance of the semiconductor diode at low voltages.

Further objects and advantages of the invention will become apparent as the following description proceeds, and features of novelty which characterize the invention will be pointed out in particularity in the claims annexed to and forming a part of this specification.

Figure 2:
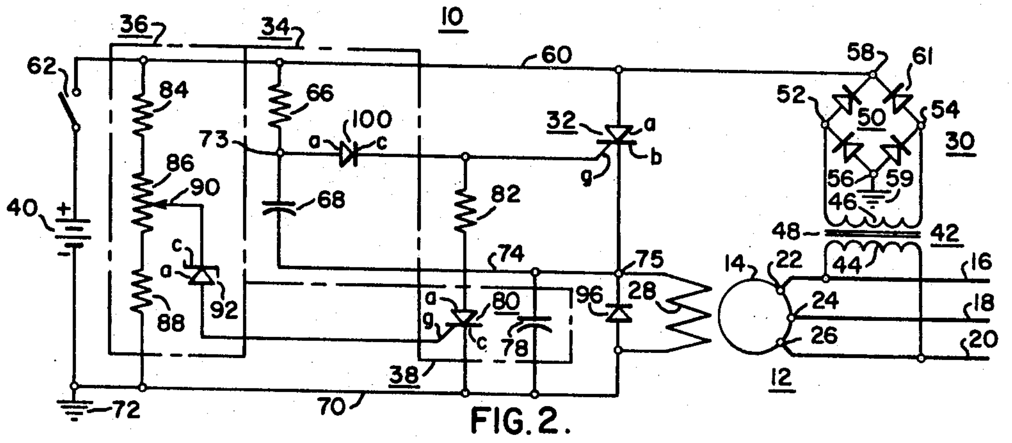

For a better understanding of the invention, reference may be had to the following detailed description taken in connection with the accompanying drawing, in which:

FIG. 1 is a schematic diagram of a regulating system constructed according to the teachings of one embodiment of the invention; and FIG. 2 is a schematic diagram of a regulating system constructed according to the teachings of another embodiment of the invention.

Referring now to the drawing, and FIG. 1 in particular, there is illustrated a regulating system 10 for regulating an electrical quantity associated with dynamoelectric machine 12. Dynamoelectric machine 12 may be an alternating current generator, as shown, a direct current generator, an alternator for automotive applications, or any other application where an electrical quantity is to be controlled by switching the excitation circuit of a dynamoelectric machine.

More particularly, alternating current generator 12 includes an armature 14 disposed to supply electrical energy to load conductors 16, 18 and 20, through output terminals 22, 24 and 26, respectively, and a field winding 28. The average unidirectional current flowing through field winding 28, controlled by regulating system 10, determines the magnitude of the electrical potential developed by armature 14 at its output terminals 22, 24 and 26.

Regulating system 10 may regulate the output potential of the dynamoelectric machine, the output current, electrical power, or any other electrical quantity, to a predetermined magnitude by utilizing appropriate sensing means for sensing the electrical quantity to be regulated. For purposes of illustration, the regulating system 10 will be described relative to regulating the output potential of dynamoelectric machine 12.

In general, regulating system 10 comprises means 30 for obtaining an electrical potential proportional to the electrical quantity to be regulated, which is, in this instance voltage, a semiconductor gate controlled switch 32, having an anode electrode *a*, cathode electrode *c* and a gate electrode *g*, means 34 for providing a turn-on signal for semiconductor gate controlled switch 32 upon start-up of the regulating system 10, and each time the semiconductor gate controlled switch 32 is turned off, means 36 for providing an error signal when the electrical quantity to be regulated exceeds a predetermined magnitude, and means 38 for providing a turn-off signal for semiconductor gate controlled switch 32 in response to the error signal for means 36. The anode-cathode circuit of semiconductor gate controlled switch 32 is connected in series circuit relation with field winding 28 of dynamoelectric machine 12.

Dynamoelectric machine 12 may be self-excited, as illustrated in FIGS. 1 and 2, wherein means 30 may provide the excitation potential, as well as a potential proportional to the output voltage on the dynamoelectric machine 12, or it may be separately excited from a separate source of unidirectional potential. If self-excited, a source of potential represented by battery 40 may be utilized for field flashing purposes, or if separately excited, source of potential 40 could supply the separate excitation potential.

Broadly, source of potential 40 initiates means 34, which provides a turn-on signal for semiconductor gate controlled switch 32, switching semiconductor gate controlled switch 32 from its high impedance to its low impedance condition. When semiconductor gate controlled switch 32 switches to its low impedance condition, field current from source potential 40 is allowed to flow through field winding 28, causing dynamoelectric machine 12 to build up a potential at its output terminals 22, 24 and 26. A measure of the output potential of dynamoelectric machine 12 is applied to means 36, and when the output potential of dynamoelectric machine 12 reaches a predetermined magnitude, means 36 provides an error signal which is applied to means 38. Means 38 then applies a turn-off signal to semiconductor gate controlled switch 32, which switches semiconductor gate controlled switch 32 to its high impedance condition. After a predetermined delay period, means 34 will again apply a turn-on signal to semiconductor gate controlled switch 32, and the cycle of events hereinbefore enumerated will be repeated. Semiconductor gate controlled switch 32 is thus switched "on" and "off" to obtain the ratio of switch "on" time to switch "off" time required to provide the average field excitation current to maintain the electrical quantity to be regulated at a predetermined magnitude. It should be noted, however, that only the switch "on" time is variable, with the switch "off" time being a predetermined uniform period of time.

More specifically, in order to obtain a measure of the output potential of dynamoelectric machine 12, for sensing purposes, and also for obtaining an excitation potential for field winding 28, a potential transformer 42 and bridge rectifier 50 may be utilized. Potential transformer 42 may have windings 44 and 46 disposed in inductive relation with a magnetic core 48, and bridge rectifier 50 may be a single phase, full wave bridge rectifier having input terminals 52 and 54, output terminals 56 and 58, and a plurality of semiconductor diodes 61. Winding 44 may be connected to the electrical conductors 16 and 18, and winding 46 may be connected to input terminals 52 and 54 of bridge rectifier 50. A unidirectional potential proportional to the output potential of dynamoelectric machine 12 appears across output terminals 56 and 58, with terminal 56 being grounded at 59, if desired. If the output potential of dynamoelectric machine 12 may be unbalanced, potential transformer 42 and bridge rectifier 50 may be polyphase, instead of being single phase, as illustrated. The potential from terminal 58 of bridge rectifier 50 is applied to the anode *a* of semiconductor gate controlled switch 32, and to bus 60. A source of unidirectional potential, represented by battery 40, is also connected to bus 60, through a switch 62. Switch 62 is provided to indicate that the source of potential 40 may be removed after the regulating system and the dynamoelectric machine 12 have been started, as it is only required to start the regulating system 10 and provide initial excitation to the dynamoelectric machine 12. Switch 62 may be manually controlled, or it may represent an automatic system such as disclosed in application Ser. No. 260,770, filed Feb. 25, 1963, now Patent 3,249,846, issued May 3, 1966, which is assigned to the same assignee as the present application.

Upon start-up of the regulating system 10, switch 62 is closed, energizing bus 60. Bus 60 energizes means 34 for providing turn-on signals to semiconductor gate controlled switch 32. Means 34 includes resistors 66 and 67, a capacitor 68, and a unijunction transistor 64 having a rectifying contact or emitter *e* and two ohmic contacts called base-one (B1) and base-two (B2). Resistor 66 and capacitor 68 are serially connected between bus 60 and the junction 75 between the cathode electrode *c* of semiconductor gate controlled switch 32 and field winding 28. The remaining side of field winding 28 is connected to bus 70, which may be grounded at 72. The emitter *e* of unijunction transistor 64 is connected to the junction 73 between resistor 66 and capacitor 68, base-two (B2) is connected to bus 60 and base-one (B1) is connected to the gate electrode *g* of semiconductor gate controlled switch 32. Resistor 67 is connected to the bus 74 which connects capacitor 68 with junction 75.

When the voltage between the emitter *e* and B1 of unijunction transistor 64 is less than the voltage between B2 and B1 times the intrinsic stand-off ratio of unijunction transistor, the emitter *e* is reverse biased, and only a small emitter leakage current will flow. When the emitter voltage exceeds the voltage between B2 and B1 times the intrinsic stand-off ratio, the emitter *e* will be forward biased, resulting in a decrease in the resistance between the emitter *e* and B1, allowing current to flow. Thus, when switch 62 is closed, capacitor 68 will charge through resistor 66 and field winding 28, at a rate determined by the RC constant of resistor 66 and capacitor 68. When the charge on the capacitor 68 reaches the voltage between B2 and B1 times the intrinsic stand-off ratio, unijunction transistor 64 will be turned on, discharging capacitor 68 and applying a positive current pulse to the gate electrode *g* of semiconductor gate controlled switch 32. The semiconductor gate controlled switch 32 will be switched from a high impedance to a low impedance condition, allowing current from source potential 40 to flow through field winding 28. Unijunction transistor 64 will remain in a conductive condition, with capacitor 68 being limited or clamped to a voltage determined by the voltage drop between the emitter *e* and B1 of unijunction transistor 64.

With current flowing through field winding 28 of dynamoelectric machine 12, it will build up an output potential at its output terminals 22, 24 and 26, assuming that its field winding 28 or armature 14 is rotated by an external driving means (not shown). When the output potential of dynamoelectric machine 12 reaches a predetermined magnitude, switch 62 may be opened, disconnecting source potential 40, as a potential will be applied to bus 60 from bridge rectifier 50.

The turn-off signal for semiconductor gate controlled switch 32 is obtained from means 38, which includes a capacitor 78 and semiconductor controlled rectifier 80 having an anode electrode *a*, cathode electrode *c* and a gate electrode *g*. Capacitor 78 is connected from junction 75 to bus 70, and it charges when semiconductor gate controlled switch 32 switches from its high to its low impedance condition. Semiconductor controlled rectifier 80 has its anode electrode *a* connected to the gate electrode *g* of semiconductor gate controlled switch 32 through a resistor 82, and a cathode electrode *c* connected to bus 70. Its gate electrode *g* is connected to means 36, and is responsive to error signals produced by means 36.

Means 36 produces an error signal when the electrical quantity to be regulated, in this instance voltage, exceeds a predetermined magnitude. Means 36 includes a voltage divider comprising resistors 84, 86 and 88, with resistor 86 having an adjustable arm 90. Means 36 also includes a semiconductor device 92, such as a Zener diode having an anode electrode *a*, and cathode electrode *c*, which allows current flow in its normally blocking direction from its cathode to anode, when the voltage across it reaches a predetermined magnitude. Resistors 84, 86 and 88 are serially connected between buses 60 and 70, and Zener diode 92 has its cathode electrode *c* connected to movable arm 90 of resistor 86, and its anode electrode *a* connected to the gate electrode *g* of semiconductor controlled rectifier 80. Thus, by the selection of resistors 84, 86 and 88, Zener diode 92, and the setting of the movable arm 90 on resistor 86, Zener diode 92 can be made conductive at the output potential of dynamoelectric machine 12 that is to be maintained. When Zener diode 92 becomes conductive, the current flow therethrough causes semiconductor controlled rectifier 80 to be switched from its high to its low impedance condition, and capacitor 78 discharges through the cathode-gate circuit of semiconductor gate controlled switch 32. The discharge of capacitor 78 acts like a negative current pulse, which switches the semiconductor gate controlled switch 32 from its low to its high impedance condition, and prevents current from flowing from bus 60 through field winding 28. Diode 96 is a commutating diode, connected across the field winding 28, which allows the field current to decrease according to the time constant determined by the ratio of the field inductance to the field resistance when the semiconductor gate controlled switch 32 switches to its high impedance condition. After capacitor 78 discharges, switching semiconductor gate controlled switch 32 to its high impedance condition, both the unijunction transistor 64 and semiconductor controlled rectifier 80 are automatically returned to their high impedance conditions.

The output potential of dynamoelectric machine now starts to drop, returning Zener diode 92 to its blocking condition, and charging capacitor 68 from bus 60. When the voltage at junction 73 and the emitter *e* of unijunction transistor 64 reaches the magnitude of the voltage between B2 and B1 times the intrinsic stand-off ratio, unijunction transistor 64 will again be switched to its low impedance condition, applying a positive current signal to the gate electrode *g* of semiconductor gate controlled switch 32, switching semiconductor gate controlled switch 32 from its high to its low impedance condition, and again allowing current to flow from bus 60 through field winding 28. The output potential of dynamoelectric machine 12 again increases until Zener diode 92 conducts, which again causes the semiconductor gate controlled switch 32 to be switched to its high impedance condition. This sequence is very rapid, causing the output potential of dynamoelectric machine 12 to be maintained at a substantially predetermined magnitude.

Thus, in summary, the period of time that semiconductor gate controlled switch 32 is allowed to conduct is adjusted so that it provides a ratio of "on" time to "off" time that provides the average excitation current required to maintain the output voltage of the dynamoelectric machine 12 at a predetermined magnitude. The charging time of capacitor 68, which provides the delay in supplying a turn-on signal to semiconductor gate controlled switch 32, is very important. If turn-on signals were to be immediately available to the semiconductor gate controlled switch 32 after turn-off, there will be no appreciable "off" time to ratio the "on" time against, and it would not be possible to obtain the range of average excitation current required for effective regulation.

FIG. 2 illustrates another embodiment of the invention, with like reference numerals in FIGS. 1 and 2 indicating like components. The difference in the two embodiments is in the elimination of the unijunction transistor 64 and resistor 67, and their replacement with a semiconductor diode 100, having an anode electrode *a* and a cathode electrode *c*. The delay time in the production of turn-on pulses is achieved in this embodiment by the combination of the charging rate of capacitor 68, the threshold voltage of the gate electrode *g* of semiconductor gate controlled switch 32, and the inherently high impedance of diode 100 at low voltages. Once diode 100 conducts and discharges capacitor 68, the voltage that capacitor 68 can then be recharged to, as long as diode 100 conducts, is clamped to the very low voltage drop across diode 100. In operation, the embodiment of FIG. 2 is otherwise the same as described relative to FIG. 1.

The regulating system described herein may be utilized with an exciter which supplies excitation current for a still larger dynamoelectric machine. The electrical quantity to be regulated associated with the larger dynamoelectric machine would be sensed and a voltage proportional thereto applied to sensing circuit 36, with the semiconductor gate controlled switch 32 being connected to provide the average excitation current to the exciter field winding that would enable the exciter to develop an output potential, which when applied to the field winding of the larger dynamoelectric machine, would maintain the electrical quantity to be regulated at the desired magnitude.

If the regulating system 10 is utilized to control the output potential of a direct current generator, the transformer 42 and rectifier 50 would, of course, be eliminated. If the regulating system 10 is used to regulate an electrical quantity other than voltage, a potential proportional to the magnitude of the electrical quantity to be regulated would be applied to voltage sensing means 36, and a separate potential could be applied to bus 60, either from the output terminals of the dynamoelectric machine 12, or from a separate source of potential. A regulating system constructed according to the teachings of this invention, because of the relatively few components required, is very reliable, substantially maintenance free, has a reduced cost, and provides a very small package size. The gate controlled switch 32, because it always operates full on or full off, dissipates a negligible amount of power, producing a highly efficient regulating system.

Since numerous changes may be made in the above-described apparatus and different embodiments of the invention may be made without departing from the spirit thereof, it is intended that all matter contained in the foregoing description or shown in the accompanying drawings shall be interpreted as illustrative and not in a limiting sense.

I claim as my invention:

1. A regulating system for a dynamoelectric machine having a field winding and output terminals, comprising first means for supplying a unidirectional potential, second means including a semiconductor switch having main electrodes, a control electrode, and bilateral switching characteristics between high and low impedance conditions initiated by turn-on and turn-off signals, said first means, the main terminals of said semiconductor switch, and said field winding being connected in series circuit relation, third means providing a unidirectional potential responsive to the magnitude of the electrical quantity to be regulated, fourth means providing an error signal when said third means exceeds a predetermined magnitude, fifth means applying a turn-off signal to the control electrode of said semiconductor switch when said fourth means produces an error signal, and sixth means applying a turn-on signal to the control electrode of said semiconductor switch a predetermined fixed period of time after said semiconductor switch has been switched from its low to its high impedance condition.

2. A regulating system for a dynamoelectric machine having a field winding and output terminals disposed to supply electrical energy to load conductors, comprising semiconductor switching means having main electrodes and a control electrode, said semiconductor switching means having the characteristic of being switchable between high and low, and low and high impedance conditions when turn-on and turn-off signals are applied to its control electrode, respectively, a source of unidirectional potential, said source of unidirectional potential, the main electrodes of said semiconductor switching means, and said field winding being connected in series circuit relation, first means connected in circuit relation with said source of unidirectional potential and the control electrode of said semiconductor switching means for applying a turn-on signal to said semiconductor switching means upon start-up of the regulating system and a predetermined fixed period of time after said semiconductor switching means has switched from its low to its high impedance condition, second means connected in circuit relation with said load conductors for providing a unidirectional potential proportional to the electrical quantity to be regulated, third means connected in circuit relation with said second means for producing an error signal when the unidirectional potential provided by said second means reaches a predetermined magnitude, and fourth means connected in circuit relation with said third means and the control electrode of said semiconductor switching means for applying a turn-off signal to said semiconductor switching means when said third means produces an error signal.

3. A voltage regulating system for a self-excited dynamoelectric machine having a field winding and disposed to supply an electrical potential to output terminals, comprising first means connected in circuit relation with said output terminals for providing a first unidirectional potential responsive to the output potential of said dynamoelectric machine, semiconductor switching means having main electrodes and a control electrode, said semiconductor switching means having the characteristic of being switchable between high and low, and low and high impedance conditions, when turn-on and turn-off signals are applied to its control electrode, respectively, second means for providing a second unidirectional potential connected in parallel circuit relation with said first means, the main electrodes of said semiconductor switching means, said field winding, and said parallel connected first and second means being connected in series circuit relation, said second means supplying excitation current to said field winding upon start-up of said dynamoelectric machine, third means connected in circuit relation with said parallel connected first and second means and the control electrode of said semiconductor switching means for applying a turn-on signal to said semiconductor switching means upon start-up of the regulating system, and a predetermined period of time after said semiconductor switching means has switched from its low to its high impedance condition, fourth means connected in series circuit relation with said first means for producing an error signal when the first unidirectional potential provided by said first means reaches a predetermined magnitude, and fifth means connected in circuit relation with said fourth means and the control electrode of said semiconductor switching means for applying a turn-off signal to said semiconductor switching means when said fourth means produces an error signal, the period said semiconductor switching means is in its low impedance condition being controlled by said third and fourth means to control the ratio of said low impedance time to the predetermined period of time it takes said third means to produce a turn-on signal after said semiconductor switching means switches from its low to its high impedance condition, said ratio producing the average current flow through said field winding that is required to maintain the output voltage of said dynamoelectric machine at a predetermined magnitude.

4. A voltage regulating system for a dynamoelectric machine having a field winding and disposed to supply an electrical potential to output terminals, comprising, first means connected in circuit relation with said output terminals for providing a first unidirectional potential responsive to the output potential of said dynamoelectric machine, semiconductor switching means having main electrodes and a control electrode, said semiconductor switching means having the characteristic of being switchable between high and low, and low and high impedance conditions when turn-on and turn-off signals are applied to its control electrode, respectively, second means for providing a second unidirectional potential connected in parallel circuit relation with said first means, the main electrodes of said semiconductor switching means, said field winding, and said parallel connected first means and second means being connected in series circuit relation, said second means supplying excitation current to said field winding upon start-up of said dynamoelectric machine, third means connected in circuit relation with said parallel connected first and second means and the control electrode of said semiconductor switching means for applying a turn-on signal to said semiconductor switching means upon start-up of the regulating system, and also a predetermined period of time after said semiconductor switching means is switched from its low to high impedance condition, a Zener diode connected in circuit relation with said first means, said Zener diode allowing current to flow in its normally blocking direction when the first unidirectional potential provided by said first means reaches a predetermined magnitude, a semiconductor controlled rectifier having main electrodes and a control electrode, a main electrode of said semiconductor controlled rectifier being connected to the gate electrode of said semiconductor switching means, the gate electrode of said semiconductor controlled rectifier being connected to said Zener diode, said semiconductor controlled rectifier being switched from a high impedance to a low impedance condition when said Zener diode allows current to flow, and a capacitor connected in circuit relation with said semiconductor switching means which charges when said semiconductor switching means switches to its low impedance condition, and discharges when said semiconductor controlled rectifier is switched to its low impedance condition, to apply a turn-off signal to said semiconductor switching means.

5. A voltage regulating system for a dynamoelectric machine having a field winding and disposed to supply an electrical potential to output terminals, comprising first means connected in circuit relation with said output terminals for providing a first unidirectional potential responsive to the output potential of said dynamoelectric machine, semiconductor switching means having main electrodes and a control electrode, said semiconductor switching means having the characteristic of being switchable between high and low, and low and high impedance conditions when turn-on and turn-off conditions are applied to its control electrode, respectively, second means for providing a second unidirectional potential connected in parallel with said first means, the main electrodes of said semiconductor switching means, said field winding, and said parallel connected first and second means being connected in series circuit relation, said second means supplying excitation current to said field winding upon start-up of said dynamoelectric machine, third means connected in circuit relation with said parallel connected first and second means and the control electrode of said semiconductor switching means for applying a turn-on signal to said semiconductor switching means upon start-up of the regulating system, and also a predetermined period of time after said semiconductor switching means is switched from its high impedance to its low impedance condition, said third means including a resistor, first capacitor, and unijunction transistor, with said unijunction transistor producing turn-on signals a predetermined period of time after said semiconductor switching means has switched from a low impedance to a high impedance condition, said predetermined period of time being determined by the charging rate of said first capacitor through said resistor, a Zener diode connected in circuit relation with said first means, said Zener diode allowing current to flow in its normally blocking direction when the first unidirectional potential provided by said first means reaches a predetermined magnitude, a semiconductor controlled rectifier having main electrodes and a control electrode, a main electrode of said semiconductor controlled rectifier being connected to the gate electrode of said semiconductor switching means, the gate electrode of said semiconductor controlled rectifier being connected to said Zener diode, said semiconductor controlled rectifier being switched from a high impedance to a low impedance condition when said Zener diode allows current to flow, and a second capacitor connected in circuit relation with said semiconductor switching means which charges when said semiconductor switching means switches to its low impedance condition, and discharges when said semiconductor controlled rectifier is switched to its low impedance condition, to apply a turn-off signal to said semiconductor switching means, the period of time said semiconductor switching means is in its low impedance condition being controlled by said third and fourth means to provide the necessary ratio of said low impedance time to the predetermined period of time it takes said first means to produce a turn-on signal after said semiconductor switching means switches from its low to its high impedance condition, said ratio producing the average current flow through said field winding that is required to maintain the output voltage of said dynamoelectric machine at a predetermined magnitude.

6. A voltage regulating system for a dynamoelectric machine having a field winding and disposed to supply an electrical potential to output terminals, comprising first means connected in circuit relation with said output terminals for providing a first unidirectional potential responsive to the output potential of said dynamoelectric machine, semiconductor switching means having main electrodes and a control electrode, said semiconductor switching means having the characteristic of being switchable between high and low, and low and high impedance conditions when turn-on and turn-off signals are applied to its control electrode, respectively, second means providing a second unidirectional potential connected in parallel circuit relation with said first means, the main electrodes of said semiconductor switching means, said field winding, and said parallel connected first and second means being connected in series circuit relation, said second means supplying excitation current to said field winding upon start-up of said dynamoelectric machine, third means connected in circuit relation with said parallel connected first and second means and the control electrode of said semiconductor switching means for applying a turn-on signal to said semiconductor switching means upon start-up of the regulating system, and also a predetermined period of time after said semiconductor switching means is switched from its low to its high impedance condition, said third means including a first capacitor, resistor, and semiconductor diode, with said semiconductor diode producing a turn-on signal after a predetermined delay period determined by the charging rate of said first capacitor through said resistor, a Zener diode connected in circuit relation with said first means, said Zener diode allowing current to flow in its normally blocking direction when the first unidirectional potential provided by said first means reaches a predetermined magnitude, a semiconductor controlled rectifier having main electrodes and a control electrode, a main electrode of said semiconductor controlled rectifier being connected to the gate electrode of said semiconductor switching means, the gate electrode of said semiconductor controlled rectifier being connected to said Zener diode, said semiconductor controlled rectifier being switched from a high impedance to a low impedance condition when said Zener diode allows current to flow, and a second capacitor connected in circuit relation with said semiconductor switching means which charges when said semiconductor switching means switches from its high to its low impedance condition, and discharges when said semiconductor controlled rectifier is switched from its high to its low impedance condition, to apply a turn-off signal to said semiconductor switching means.

7. A regulator for regulating a predetermined quantity of a dynamoelectric machine having a field winding and output terminals, comprising:

a source of electrical potential, semiconductor switching means having main and control electrodes and being switchable between high and low impedance conditions by turn-off and turn-on signals applied to its control electrode, said source of electrical potential, the main electrode of said semiconductor switching means, and the field winding of a dynamoelectric machine being serially connected, first means providing a signal responsive to the quantity of the dynamoelectric machine to be regulated, second means responsive to said first means providing a turn-off signal for said semiconductor switching means when the quantity to be regulated exceeds the desired magnitude, and third means providing a turn-on signal for said semiconductor switching means a predetermined fixed period of time after said semiconductor switching means switches from its low to its high impedance condition.

References Cited

UNITED STATES PATENTS

| | | | |
|---|---|---|---|
| 3,173,077 | 3/1965 | Kirk et al. | 322—28 X |
| 3,209,234 | 9/1965 | Bridgeman et al. | 322—28 |
| 3,209,236 | 9/1965 | Bridgeman | 322—28 |
| 3,299,303 | 1/1967 | Newill et al. | 322—28 X |

MILTON O. HIRSHFIELD, *Primary Examiner.*

R. V. LUPO, *Assistant Examiner.*